United States Patent [19]

Cann

[11] Patent Number: 4,471,003
[45] Date of Patent: Sep. 11, 1984

[54] MAGNETOPLASMADYNAMIC APPARATUS AND PROCESS FOR THE SEPARATION AND DEPOSITION OF MATERIALS

[76] Inventor: Gordon L. Cann, P.O. Box 279, Laguna Beach, Calif. 92652

[21] Appl. No.: 365,782

[22] Filed: Apr. 5, 1982

Related U.S. Application Data

[62] Division of Ser. No. 210,240, Nov. 25, 1980, abandoned.

[51] Int. Cl.$^3$ .............................................. B05D 1/08
[52] U.S. Cl. ................................... 427/34; 204/164; 219/121 PL; 219/121 PY; 136/261; 427/38
[58] Field of Search ................. 427/34, 38; 204/164; 219/121 PL, 121 PY; 315/111.21, 111.41, 111.61, 111.71, 111.81

[56] References Cited

U.S. PATENT DOCUMENTS

| | | | |
|---|---|---|---|
| 2,537,255 | 1/1951 | Brattain | 136/89 |
| 2,763,581 | 9/1956 | Freedman | 148/1.5 |
| 3,010,009 | 11/1961 | Ducati | 219/76 |
| 3,078,328 | 2/1963 | Jones | 136/90 |
| 3,160,522 | 11/1961 | Heywang et al. | 117/229 |
| 3,274,007 | 9/1966 | Jones | 106/55 |
| 3,485,666 | 12/1969 | Sterling et al. | 117/230 |
| 3,496,029 | 2/1970 | King et al. | 148/1.5 |
| 3,563,809 | 2/1971 | Wilson | 148/1.5 |
| 3,916,034 | 10/1975 | Tsuchimoto | 427/47 |
| 4,003,770 | 1/1977 | Janowiecki et al. | 148/174 |
| 4,042,447 | 8/1977 | Reitz | 156/610 |
| 4,102,764 | 7/1978 | Harvey et al. | 204/164 |
| 4,102,765 | 7/1978 | Fey et al. | 204/164 |
| 4,102,766 | 7/1978 | Fey | 204/164 |
| 4,102,767 | 7/1978 | Mazelsky et al. | 204/164 |
| 4,102,985 | 7/1978 | Harvey | 413/350 |
| 4,123,316 | 10/1978 | Tsuchimoto | 156/643 |
| 4,139,438 | 2/1979 | Fey et al. | 204/164 |
| 4,194,212 | 3/1980 | Lindmayer | 357/30 |
| 4,201,152 | 5/1980 | Luscher | 118/729 |
| 4,214,187 | 7/1980 | Mourier | 315/111.81 |
| 4,233,937 | 11/1980 | Steube | 118/733 |
| 4,268,711 | 5/1981 | Gurev | 136/256 |
| 4,297,388 | 10/1981 | Kumar et al. | 427/47 |

*Primary Examiner*—John H. Newsome
*Attorney, Agent, or Firm*—Sherman & Shalloway

[57] ABSTRACT

A plasma arc discharge method for deposition of metallic and semiconductor layers on a substrate for the purpose of producing semiconductor grade materials such as silicon at a reduced cost is disclosed. Magnetic fields are used so that silicon ions and electrons can be directed toward a target area where they are deposited. The ions and electrons are preferably injected as a compound in gaseous or liquid form but may also be injected in liquid elemental form or vaporized from a thermionic cathode. The magnetic fields include an accelerating magnetic field and a focusing magnetic field. The accelerating magnetic field is adjusted to support a desired high ion flux rate and the focusing magnet can control the plasma beam direction and divergence.

The silicon provided in a compound form or in the form of metallurigical silicon is purified during the deposition process by a carrier substance which may be a part of the compound or separately injected. Chemical purification is accomplished by separation of the silicon due to ionization potential differences between silicon and other elements. The magnetic acceleration technique allows the use of pressures under $10^{-1}$ torr thereby facilitating plasma formation and allowing the materials to be deposited with a desired high purity.

11 Claims, 3 Drawing Figures

MAGNETOPLASMADYNAMIC APPARATUS AND PROCESS FOR THE SEPARATION AND DEPOSITION OF MATERIALS

This is a division of application Ser. No. 210,240, filed Nov. 25, 1980, now abandoned.

BACKGROUND OF THE INVENTION

Field of the Invention

The separation of materials can be accomplished by the application or the influencing of forces on intrinsic species of the material or on species of a compound of materials. These forces can be gravitational, electromagnetic, chemical, gas (fluid) dynamic and/or a combination of these forces. The forces will provide different acceleration to the species thereby giving different spatial and temporal characteristics to the desired separation. The material could be in the solid, liquid, vapor or plasma state, or a combination of these states. The magnetoplasmadynamic process encompasses each or a combination of these states.

The magnetoplasmadynamic phenomena was first discovered in 1961 by Cann and described in U.S. Pat. No. 3,243,954. A device that was designed and tested was intended for space propulsion applications and is commonly known as an ion propulsion system. The principal design and performance requirements were to fully ionize a single species vapor and accelerate all the ions to a preferred high velocity into space. The device was to have high thrust efficiency, where thrustor efficiency was defined as $$\text{Thrust efficiency} = \eta_{mass} \cdot \eta_{exhaust} \cdot \eta_{power}$$

where $$\eta_{mass} = \text{mass utilization efficiency} = \frac{\text{mass ionized}}{\text{mass injected}}$$

and $$\eta_{exhaust} = \text{exhaust efficiency} = \frac{\bar{v}}{v_{max}} = \frac{\text{average velocity of ions}}{\text{maximum velocity of ions}}$$

and $$\eta_{power} = \text{power efficiency} = \left(\frac{\text{electrical power input}}{\text{thrust power}}\right)^{-1}$$

$$\text{Thrust Power} = \overset{\circ}{m}_{ions} \times (\bar{v})^2$$

where $\overset{\circ}{m}_{ions}$ = mass flow of ions $\bar{v}$ = average velocity of ions No attempt was made to separate materials in this process as the intended application did not direct the development to that end.

The magnetoplasmadynamic phenomenon simply comprises the controlled interaction of a plasma and an applied magnetic field through the induced magnetic field resulting when the plasma is accelerated by an appied electrostatic field (potential). This type of interaction phenomena is referred to as the Hall Current effect. The significance of the work of Cann and others was the controlled feed or propellant injection into the cavity anode region. The proper voltage selection and propellant injection rate resulted in ionization and acceleration of the charged particles (ions and electrons) in the direction parallel to the applied magnetic field. The resulting plasma was accelerated to the desired exhaust velocity.

This invention relates to the separation of materials by new and improved methods employing magnetoplasmadynamics. The invention allows the separation and collection of materials that cannot be separated by other techniques or processes. The invention also separates materials that can be separated by other techniques or processes but this invention would separate the material at lower costs.

An important use of methods and apparatus of this invention is the production of semiconductor grade silicon from low-cost silicon compounds as the feed material. Semiconductor grade silicon is considered to be silicon which is made at least 99.9999% pure by refining techniques. For efficient operation of silicon solar cells the semiconductor grade silicon should actually be at least 99.999% pure and preferably 99.9999% pure. On the other hand, silicon which is at least 97% pure is considered to be metallurgical grade silicon. Commercially available metallurgical grade silicon is approximately 98% pure. The cost of semiconductor grade silicon is significantly greater than that of metallurgical grade silicon. In 1980, semiconductor grade silicon cost approximately $80./Kg, whereas metallurgical grade silicon cost less than $1.00/Kg.

Ironically, the semiconductor grade is valued because it is usually used in products which require that specified impurities or "dopants" be added to the silicon. These dopants affect conductivity of the silicon and create donor and receptor portions on semiconductor devices. Therefore, as used in this specification, "semiconductor grade silicon" should be construed to include the highly pure silicon which has dopants added.

As noted, the semiconductor grade silicon is used to produce divers semiconductor devices, including silicon solar cells. It is essential that the cost of solar cell production be reduced so that the cost of production of solar cells be recovered over the expected lifetime of the solar cells. At the present time silicon solar cells are made from single crystals of n-type silicon about 4 centimeters in diameter and as long as a sausage. These crystals are made by rotating and pulling at a slow regulated pace. The elongated crystal is then cut into slices approximately 50 microns thick by means of a diamond-tipped circular saw. After the slices are ground, lapped and chemically cleaned, they are placed in a diffusion chamber which consists of a long quartz tube running through a cylindrical electric furnace. In the diffusion chamber, the crystals are heated to 1150° in an atmosphere of boron trichloride. Elemental boron, which decomposes from the boron compound, diffuses into the outer surfaces of the silicon wafers, thus doping the wafers to create a p-type layer less than 0.3 microns thick. Further processing is necessary to create the terminals and to expose the n-type silicon, now sandwiched in the middle.

While this process may be ideal for the production of small electronic components, the steps involved put the price of solar cell panels at over $12,000.00 (1973 dollars) per kilowatt of generated power. While the real cost of production is expected to decrese in accordance with the refinement of production techniques and mass production, the price is still several orders of magnitude too large for solar panels to be used commercially for power production in other than remote areas such as space ships. Also, in many cases the energy spent in production cannot be recovered over the expected lifetime of the solar cells.

Several systems have been proposed for the production of semiconductor devices, such as solar cells, by other means. For example, Janowiecki, et al., U.S. Pat. No. 4,003,770 (also U.S. Patent Office Voluntary Protest Program Document No. B 65,105) discloses a process for preparing solar cells in which p- or n-doped silicon particles are injected into a plasma stream where the particles are vaporized. The heated particles are then discharged from the plasma stream onto a substrate to provide a polycrystalline silicon film. During the heating and spraying, a suitable atmosphere is provided so that the particles are surrounded to inhibit oxidation. However, Janowiecki, et al. do not suggest the use of his techniques for refining the silicon. Walter H. Brattain in U.S. Pat. No. 2,537,255, discloses the deposition of silicon for silicon photo-emf cells, using a mixture of hydrogen and silicon tetrachloride. However, this early technique does not disclose the use of a magnetoplasmadynamic effect for either production of these solar cells, nor the refining of metallurgical grade silicon into semiconductor grade silicon.

Tsuchimoto in U.S. Pat. No. 3,916,034 discloses a method for transporting semiconductors in a plasma stream onto a substrate. The plasma is directed by magnetic fields onto thin film substrates. Tsuchimoto is typical of conventional ionization chambers for use with a magnetogasdynamic process. In that magnetogasdynamic process, mass utilization efficiency is low, making the method ineffective for refining mass quantities of silicon.

It is also possible to provide a deposition system using a magnetoplasmadynamic arc in which a magnetic nozzle is produced by a magnetic coil and/or the self-magnetic field of discharge. This magnetic nozzle permits a higher ion density in the plasma jet, giving better control over the distribution of silicon in the jet. The anode attachment can be diffused or made to rotate rapidly during the electromagnetic (j×B) forces, permitting uniform erosion of the anode. However, this system provides a "modal" performance, in that small changes in the mass flow rate critically affect the voltage requirements of the system. In this system, an insulator between the anode and cathode is subject to erosion or may short out the discharge by being coated during the operation of the plasma device.

SUMMARY OF THE INVENTION

It is accordingly an object to provide a method and apparatus for refining silicon, and particularly for refining metallurgical grade silicon into a purer form of silicon to produce semiconductor grade silicon.

It is a further object to produce semiconductor grade material in thin films having large areas, thereby providing an inexpensive base product for making silicon photovoltaic solarcells.

It is a further object of this invention to provide a method of refining materials such as silicon in layers using magnetoplasmadynamic techniques.

Accordingly, it is a further object of the present invention to provide a new and improved method and apparatus for the separation of materials which does not depend upon conventional chemical reduction processes, conventional catalytic processes, vapor transport processes, laser heating, differential ionization, electron beam heating or a melted crystal pull process to obtain separation of species. However, a further object of the invention is to provide a new and improved means of electromagnetic separation by selective ionization and acceleration in a magnetic field. Particularly it is an object to provide a method and apparatus which has a low cost relative to present separators and which requires less power to operate.

It is a further object of the present invention to provide a means to form large area silicon films used for solar cells, and particularly large area silicon solar cells in a process which is economical to operate and which has a low power consumption.

It is still a further object to refine silicon for solar cells to be used in terrestrial applications in which the cost of production of the solar cells, and particularly the power consumption costs of production, are significantly less than the value of the power expected to be produced by the solar cells during lifetime of the solar cells.

Accordingly, the invention, in one aspect thereof, is directed to an apparatus for depositing materials in layers to form semiconductive devices by means of electrodeposition. A plasma spray is magnetically accelerated in a vacuum chamber by means of a magnetoplasmadynamic generator comprising a cathode, an anode an accelerating magnet adjacent to the cathode and a focusing magnet. The focusing magnet has a flux pattern which can be rotated so as to direct the plasma spray in different directions as the plasma spray is ejected from the plasma generator. In one aspect of the invention, a means is provided for injecting materials into the plasma in order to create a plasma stream. These injected materials may comprise a carrier used for separating undesired impurities from the silicon in the plasma spray. The injected materials may also comprise dopants used for depositing a doped layer of the semiconductor. The doped layer can be of any desired thickness.

In another aspect, the focusing magnet may be placed on a gimball so as to allow the magnetic flux field of the focusing magnet to be rotated, thereby permitting deposition of materials evenly on various portions of the target area.

In yet a further aspect of the invention, the apparatus is used to deposit a substrate before the semiconductor material is deposited.

In still another aspect, this invention is directed to a method for producing semiconductor materials such as semiconductor grade silicon in a vacuum environment. A plasma is established between a cathode and an anode. The plasma is accelerated with an accelerating magnet and focused onto a deposition area located on a target area with a focusing magnet. The semiconductor material, such as silicon, is placed in the plasma, thereby forming the plasma stream, and a carrier substance is injected into the plasma stream in order to purify the semiconductor material while it is in the plasma.

The deposition area may be moved along the target area by changing the flux orientation of the focusing magnet.

In yet another aspect, the completed semiconductor films may be removed from the target area by a robot means so that subsequent semiconductor films may be formed without the requirement that the vacuum chamber be pumped down each time a new seminconductor film is to be formed.

In yet another aspect, this invention is directed to a method for refining materials such as semiconductor grade silicon, and particularly to the refining of silicon in which a vacuum environment is provided and a plasma is accelerated with an accelerating magnet and focused onto a target area with a focusing magnet. The material to be refined is placed in the plasma, thereby forming a plasma stream. A carrier substance combines with impurities in the materials to be refined. Therefore, the material is deposited onto the target area while impurities found in the material are removed with the substance primarily as a compound with the carrier by means of a vacuum pumping apparatus. By adding appropriate materials, such as dopants, the refined material can be modified in the plasma stream as the material is being deposited on the target area. This invention also provides a means for preferential isotope separation. Separation of most compounds can also be effected for purification, etc.

DETAILED DESCRIPTION OF THE PREFERRED EMBODIMENTS

Figure 1:
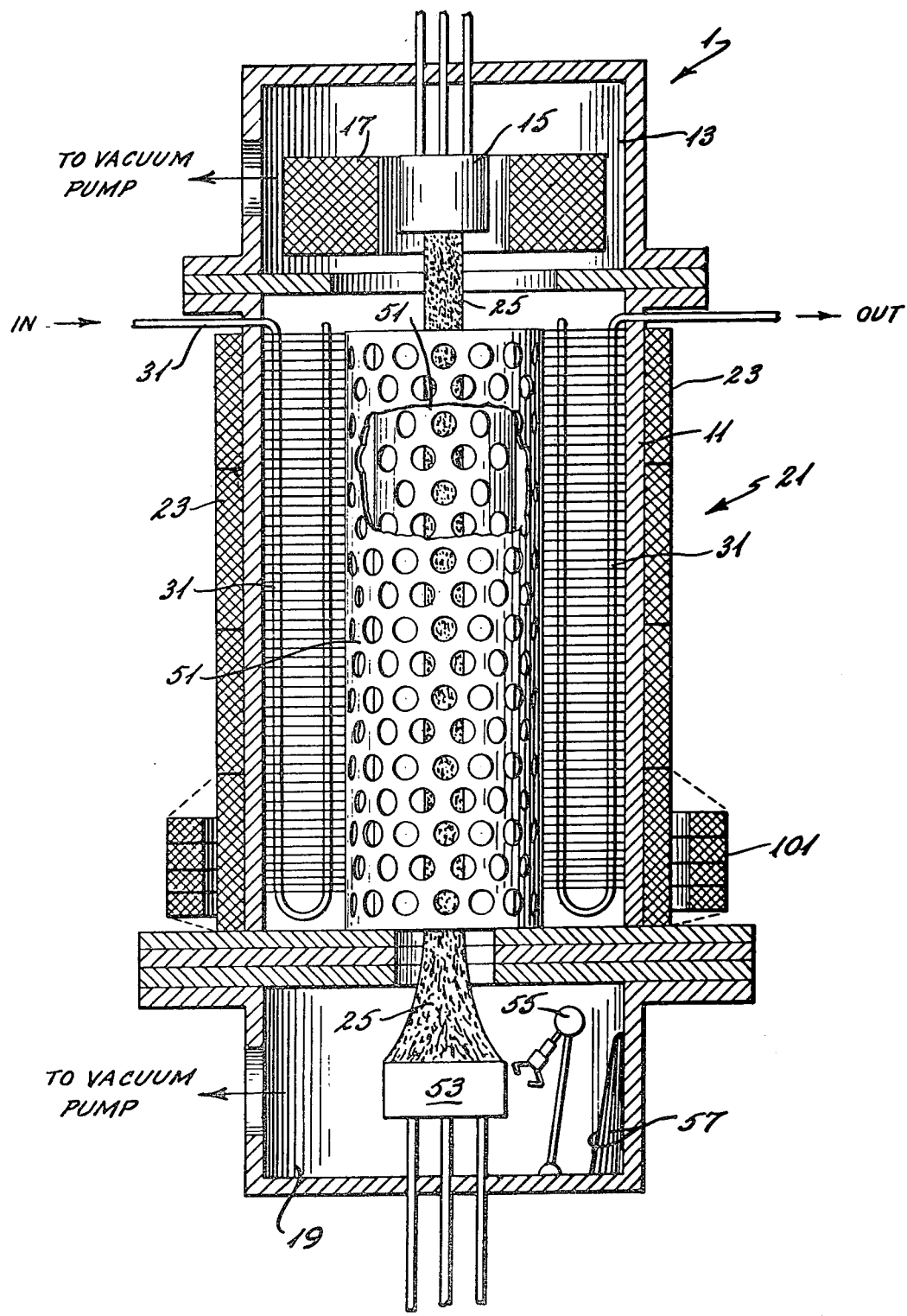
FIG. 1 is a schematic representation of the magnetoplasmadynamic device according to the invention.

Referring to FIG. 1, the magnetoplasmadynamic deposition device 1 according to the invention is contained within a vacuum housing 11. In an upper portion 13 of the magnetoplasmadynamic device 1, is an arc-forming section 15 surrounded by an accelerating magnet 17 and the lower portion of the magnetoplasmadynamic deposition device 1 forms a deposition chamber 19. A center portion 21 of the device 1 is surrounded by a focusing magnet 23, with the deposition chamber 19 located directly below the arc. Plasma in the arc-forming section 15 may be accelerated downward by the accelerating magnet 17. The focusing magnet 23 tends to maintain the plasma within a narrow column, designated by reference 25, until the plasma reaches the deposition chamber 19.

In order that some of the ions in the column 25 may be projected into the deposition chamber 19, it is necessary that a vacuum be maintained within the vacuum housing 11 so that the ions within the plasma column 25 are not obstructed by other fluid material between the arc-forming section 15 and the deposition chamber 19. In the preferred embodiments, a very high vacuum is maintained so that the pressure is below $10^{-4}$ Torr. It is preferred that a vacuum of $10^{-10}$ Torr be maintained, although this may prove uneconomical, particularly if substantial amounts of carrier materials are used. In order to accomplish these high vacuums, a combination of cyrogenic and ionic pumping is used, using conventional cyrogenic and ionic pumps (not shown).

Additional extraction of carrier materials is accomplished by a liquid nitrogen-cooled coil assembly 31. The coil assembly 31 is located in the center portion 21 so as to surround the column of plasma 25. Gases which escape from the plasma within the column 25 then condense on the coil assembly 31.

Figure 2:
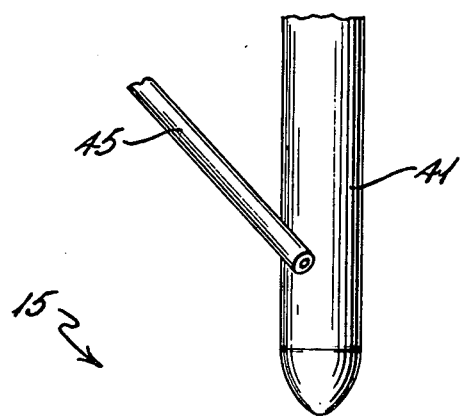
FIG. 2 is a schematic representation of the arcforming section of a preferred embodiment of the invention.
Figure 2:
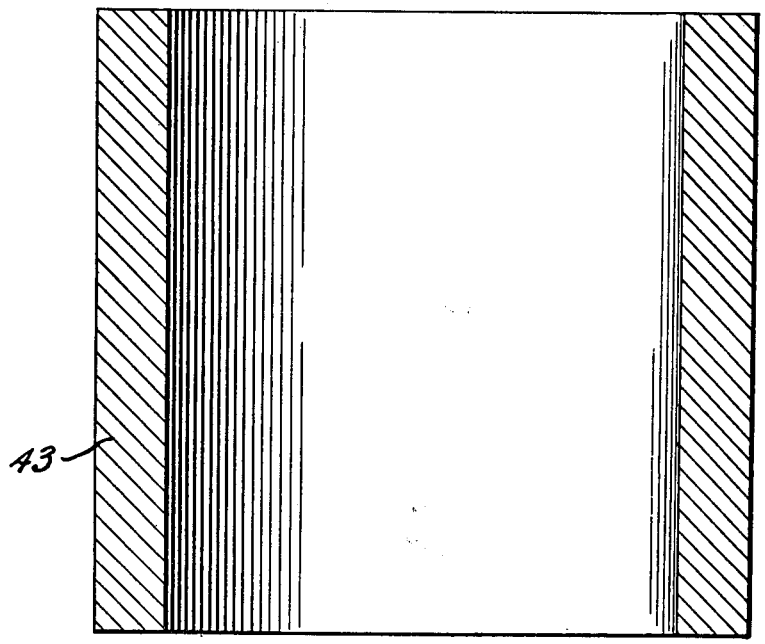

As shown in FIG. 2, the arc-forming section 15 comprises a rod-like cathode 41 and a cylindrical anode 43. An injector 45 is mounted adjacent the cathode so as to permit injected fluid to pass over the cathode 41. When an arc is established between the cathode 41 and anode 43, fluid in the vicinity of the arc is ionized, thus forming an ionized plasma stream.

Referring back to FIG. 1, the fluid ionized in the arc-forming section 15 is accelerated by the accelerating magnet 17 and focused by the focusing magnet 23 in order to form the narrow column of plasma 25. However, if the fluid injected by the injector 45 is composed of or forms elements and compounds of differing ionization potentials, the elements or compounds with the highest ionization potentials will if ionized be more affected by the magnetic forces and will therefore tend to displace those elements or compounds with a lower ionization potential within the column of plasma 25. Furthermore, if binary, rather than ionic compounds are formed, these compounds will tend to very rapidly separate themselves from the plasma stream. Thus, such binary compounds may be rapidly extracted. In other words, the ions formed by injecting fluid with the injector 45 are under the influence of the electromagnetic fields formed by the accelerating and focusing magnets 17, 23, and follow restricted trajectories. Those atoms whih are not under the influence of the electromagnetic field are free to diffuse out of the plasma stream. The different trajectories provide a means for separating material species.

Because of the different ionization potentials and molecular weights of different materials, the materials can also be separated by ionizing all of the materials. The resulting ions will have different masses and ionization potentials and will, therefore, have different trajectories as they come under the influence of the electromagnetic fields of the accelerating and focusing magnets 17, 23.

As will be described later, in the preferred embodiment, silicon tetrachloride will be the primary material injected through the injector 45. Elemental silicon becomes separated from the compound in the arc-forming section, thereby leaving chlorine and impurity-containing chlorides. The device must now incorporate some technique of separating the chlorine from the silicon while still insuring that the partial pressure (of chlorine) within the vacuum housing 11 remains adequately low (less than $10^{-4}$ Torr). Because of the difference in the ionization potential between silicon and chlorine, the arc will preferentially ionize the silicon. The silicon ions will be trapped by the applied magnetic fields and the chlorine will diffuse out of the narrow column of ions 25. The coil assembly 31 constitutes the primary element in a cyrogenic pumping tower. Between the column of ions 25 and the coils assembly 31 are baffles 51 which serve to protect the coil assembly 31 and to prevent the coil assembly 31 from disturbing the narrow beam of plasma.

When the narrow beam of plasma 25 enters the deposition chamber, ions remaining the narrow beam of ions deposit upon a target 53, thus forming a layer or a semiconductor device. Since it is desired that ultimately the semiconductor materials be used outside the device 1, the semiconductor materials, such as the silicon should be removable from the target area. There are several methods of accomplishing this:

1. A semi-permanent or temporary layer of a material to which the silicon does not adhere may be placed over the target area. An example of this type of material would be boron nitrite. Depending upon the interface temperature, the boron nitrite will decompose to some extent and the boron will diffuse into the silicon film deposited on the boron nitrite. This results in heavy doping which renders the bottom surface of the silicon conducting (approximately $= 10^{-3}$ ohms/cm). This permits the bottom surface to act as a back conductor for a semi-conductor device which will be formed from the semiconductor material.

2. The silicon can be deposited on a reducble substrate sheet of a refractory material such as molybdenum or tungsten. By properly controlling the thermal cycling of the substrate, the silicon deposited thereon can be made to break loose from the refractory sheet due to the difference in the thermal expansion coefficients of the two materials.

3. The silicon can be deposited on the surface of a "lake" of high density, low vapor pressure liquid metal such as tin.

Where the silicon is deposited on solid material (as in cases 1 and 2), it may be desirable to scribe the target materials with grooves in order to facilitate directional growth of metallic crystals which are deposited on the target materials. These grooves could be 5-19 microns deep, 5-10 microns wide and have a center-to-center separation of 10-15 microns between adjacent grooves. This will encourage crystalline nucleation centers formed during the deposition of the silicon to align, thereby producing large crystals or even a single crystalline film.

Dopant Injection

It is possible to inject a dopant material into the plasma stream in order to provide a doped layer on the semiconductor material while controlling the depth and density of the doped layer. This is done by injecting a dopant simultaneously with the primary semiconductor material, either in the same injection port or separately.

Thus, as the semiconductor ions are deposited, the dopant, which is placed in the narrow column of plasma 25, diffuses into the silicon when the silicon is deposited onto a target 53.

Also, as mentioned before, when silicon is deposited on a sheet of boron nitrite, boron doping of the silicon will occur, especially near the interface between the silicon and the boron nitrite. The temperatures of the substrate and of the film will determine the concentration and penetration of the boron into the silicon.

The following table lists the physical properties of the various materials injected by the system. Ideally, the material injected should be in a fluid form. The ionization potential of those elements which are to be deposited should be relatively high and the ionization potential of carrier materials should be relatively low. The melting and boiling points of the materials are important for the purposes of extracting the materials by passing cryogenic materials through the coil assembly 31.

| Symbol | Material | Mol. Wt. | Ionization Potential | Chloride and/or Hydride | M.P.C° | B.P.C° | Vapor Pressure 195.8° C. (Torr) |
|---|---|---|---|---|---|---|---|
| Si | Silicon | 28.06 | 8.12 | (M.P.Si = 1420° C.) | | | |
| Cl | Chlorine | 35.46 | 12.95 | $Cl_2$ | −101.6 | −34.7 | $10^{-9}$ |
| H | Hydrogen | 1.00 | 13.53 | $H_2$ | −259.14 | −252.8 | $10^3$ |
| N | Nitrogen | 14.01 | 14.48 | $N_2$ | −209.86 | −195.8 | 760 |
| | Hydrogen Chloride | 36.46 | N.A. | HCl | −112 | −83.7 | $1.5 \times 10^{-5}$ |
| Preferred Substances | | | | | | | |
| 1. | Tetra chloro-silane | 168.29 | N.A. | $SiCl_4$ | −70 | 57.57 | N.A. |
| 2. | Tri-chloro-silane | 135.44 | N.A. | $SiHCl_3$ | −134 | 33. | N.A. |
| 3. | Di-chloro-silane | 100.99 | N.A. | $SiH_2Cl_2$ | −112 | 8.3 | N.A. |
| 4. | Chloro-silane | 66.54 | N.A. | $SiH_3Cl$ | −118.1 | −30.4 | N.A. |
| 5. | Silane | 32.09 | N.A. | $SiH_4$ | −185 | −111.8 | N.A. |
| 6. | Disilane | 62.17 | N.A. | $Si_2H_6$ | 132.5 | −14.5 | N.A. |
| 7. | Tri-silane | 92.24 | N.A. | $Si_3H_8$ | −177.4 | 52.9 | N.A. |
| 8. | Tetra-silane | 122.32 | N.A. | $Si_4H_{10}$ | −93.5 | 80 | N.A. |

Process Automation Considerations

In order to produce many square meters of semiconductor grade silicon film with one vacuum pump-down operation, some method of moving the substrate and/or the target material must be devised. In the embodiment in which a solid substrate is used for a target area, solar cell films which are deposited on the target 53 would be removed from the target 53 and stored within the vacuum housing 11, thereby allowing subsequent films to be deposited at the target 53.

A robot 55 would be used to lift the subsequent films from the target 53. A plurality of completed films 57 are then stored by the robot 55 in the deposition chamber 19 away from the target 55 and the plasma column 25. It can be seen that this storage of completed films 56 permits the device 1 to continue to deposit subsequent films.

It is also possible to have the robot 55 place preformed substrates (not shown) on the target 53 prior to the deposition of each film by the device. Thus the completed films 57 would each have their own substrates which may be left with the films or later separated from the films.

In the case where the silicon is deposited on the surface of the liquid metal, the robot 55 may be used to pull the film along the surface of the liquid. The film may be continuously deposited and a cutting means such as a laser (not shown) may be used to sever the film into desired lengths before the lengths are stored as completed films 57.

Operation

Figure 3:
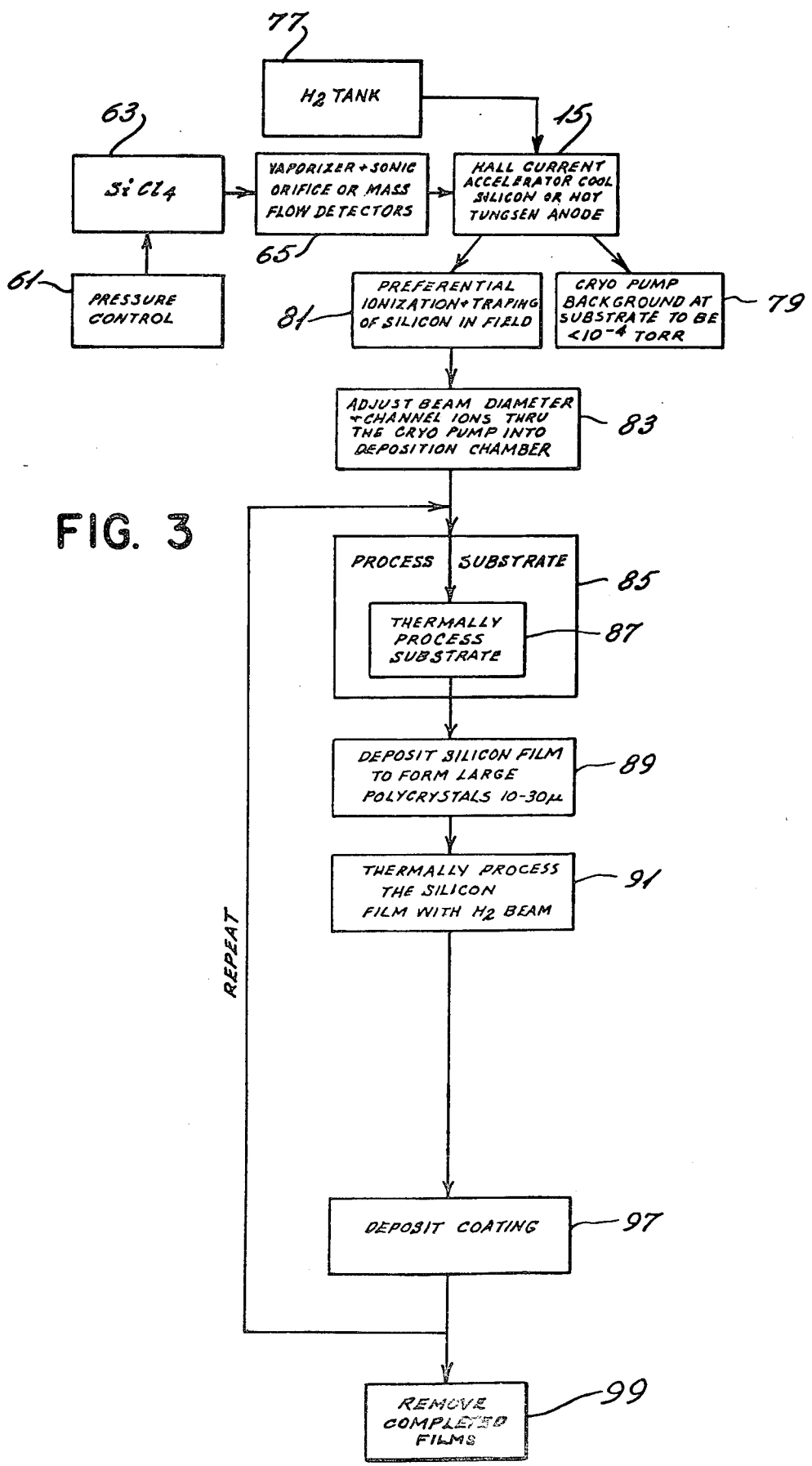
FIG. 3 is a block diagram representing the process of forming semiconductor films in accordance with this invention.

Referring to FIG. 3, the process of refining silicon is achieved by carefully controlling the different materials that are injected into the system, as well as the arc control and plasma focusing parameters. Pressure from a pressure control 61 is applied to a source of silicon tetrachloride 63. The silicon tetrachloride is injected into the arc-forming section 15 by means of a vaporizer and flow controller apparatus 65. Hydrogen from a hydrogen source 77 may be injected in order to provide additional carrier gas to remove impurities and to facilitate the formation of plasma spray. The various gases formed in the arc-forming section 15 are pumped out at a vacuum pumping section 79. The ions emitted from the arc-forming section 15 are preferentially ionized in order to direct silicon and other materials to be deposited at the target 53 (FIG. 1) in a step represented by block 81. This is achieved by the out-gassing performed by the vacuum pumping section 79, as well as the focusing magnets 23. The focusing magnets direct the ions toward the target 53 in the deposition chamber 19, as represented by step 83. In step 85, the substrate is prepared to accept the column of ions 25. This step includes the thermal processing of the substrate in order to provide the substrate at a proper temperature to either adhere or gradually separate from the deposited materials, as desired. This is represented as a part of the processing of the substrate by block 87. The ions, as they impinge upon the target, form a crystalline film, represented by a step 89. The hydrogen provided at 77 may be used to form a plasma beam in order to thermally process the silicon and to prepare the silicon to receive a dopant layer. This is represented by block 91.

Final processing performed at block 97. This processing may include the deposition of a thin arsenic layer in order to improve the photosensitive characteristics of the resultant photocells. Finally, in step 99, after the last silicon films are formed, the completed films 57 are removed from the deposition chamber 19.

Articulating Magnets

If it is desired to create large area film substrates, it is necessary to articulate the target 53 with respect to the narrow column of plasma 25. This articulation provides a larger spray pattern on the target 53 than would be achieved by merely permitting the column of plasma 25 to diffuse.

As previously mentioned, in the case in which the narrow column of plasma 25 is focused onto a liquid metal substrate, the robot 55 may be used to pull the deposited materials along the "lake" of liquid metal, thus effectively removing the target 53 relative to the narrow column of plasma 25.

However, when a solid substrate is used, it is necessary to either move the target 53 or the column of plasma 25. If it is desired that the target 53 be retained in a specific location, then the narrow column of plasma 25 may be articulated by shifting the magnetic fields of the focusing magnet 23. This can be achieved by providing an articulating portion 101 of the focusing magnet 23. The articulating portion 101 functions as a part of the focusing magnet 23 but is capable of shifting its magnetic axis or of shifting its flux pattern in order to angularly divert the narrow beam of plasma 25 as the plasma approach the target 53. This may be done by selectively energizing parts of the articulating portion 101 or by physically rotating the portion 101 on a gimball apparatus.

While my invention is described in what is believed to be a preferred embodiment, it is anticipated that further modifications will have to be made in order to increase the efficiency of operation of a magnetoplasmadynamic refining technique. As an example, it is possible to deposit a plurality of silicon films on the target 53 with removable or disposable substrates deposited between the films in a sandwich-like fashion. This would eliminate the necessity to store the completed films away from the target 53. It is anticipated that other elemental semiconductors, such as germanium, may be used in place of silicon. Accordingly, my invention is described but not limited by the description of the preferred embodiment.

I claim:

1. A method for refining semiconductor materials comprising:
    (a) providing a vacuum environment;
    (b) establishing a plasma between an anode and a cathode;
    (c) accelerating the plasma with an accelerating magnet;
    (d) placing a substance comprising a semiconductor metal in the plasma, thereby forming a plasma stream;
    (e) focusing the plasma stream with a focusing magnet onto a deposition area;
    (f) injecting a carrier substance into the plasma stream, the carrier substance chemically combining with impurities in the semiconductor materials in the plasma stream, whereby the semiconductor metal is dissociated from impurities in the plasma stream prior to said deposition.

2. The method of claim 1 wherein the semiconductor material is injected into the plasma.

3. The method of claim 2 wherein the semiconductor material is injected as an element in liquid form.

4. The method of claim 1 wherein the semiconductor material is placed in the plasma in the form of a thermionic cathode.

5. The method of claim 1 wherein the semiconductor material is silicon.

6. A method for refining silicon comprising:
    (a) providing a vacuum environment;
    (b) establishing a plasma between a cathode and an anode;
    (c) accelerating the plasma with an accelerating magnet;
    (d) focusing the plasma onto a deposition area located on a target area with a focusing magnet;
    (e) placing a semiconductor material in the plasma, thereby forming a plasma stream;
    (f) injecting a carrier substance into the plasma stream, the carrier substance chemically combining with impurities in the semiconductor material in the plasma stream;

(g) withdrawing the carrier substance and impurities from the vacuum chamber by means of vacuum pumps.

7. The method of claim 6 wherein the semiconductor materials is placed in the plasma by forming the cathode as a thermionic cathode made of said semiconductor materials.

8. The method of claim 6 wherein the semiconductor material is placed in the plasma by injection means.

9. The method of claim 6 or 8 wherein the vacuum pump comprises a combination of a cryogenic pump and an ionic pump.

10. The method of claim 8 wherein the semiconductor material is silicon.

11. The method of claim 10 comprising the further step of selectively injecting a dopant into the plasma stream, so that the refined silicon is provided with a doped layer.

* * * * *